US006805626B2

(12) United States Patent
Chen

(10) Patent No.: US 6,805,626 B2
(45) Date of Patent: Oct. 19, 2004

(54) COMPUTER ENCLOSURE INCORPORATING FIXING STRUCTURES FOR FANS

(75) Inventor: Yun-Lung Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/668,072

(22) Filed: Sep. 19, 2003

(65) Prior Publication Data

US 2004/0164652 A1 Aug. 26, 2004

(30) Foreign Application Priority Data

Feb. 26, 2003 (TW) ................................. 92202951 U

(51) Int. Cl.[7] ............................................. H05K 5/00
(52) U.S. Cl. .................... 454/184; 361/695; 312/236
(58) Field of Search ........................... 454/184, 185, 454/195; 361/695, 696; 165/80.2, 104.33, 104.34; 312/236

(56) References Cited

U.S. PATENT DOCUMENTS

| 5,101,321 | A | | 3/1992 | Remise et al. | |
|---|---|---|---|---|---|
| 5,121,291 | A | * | 6/1992 | Cope et al. | 361/695 |
| 5,481,429 | A | * | 1/1996 | Eriksson et al. | 361/678 |
| 5,540,548 | A | * | 7/1996 | Eberhardt et al. | 415/182.1 |
| 5,544,012 | A | * | 8/1996 | Koike | 361/695 |
| 5,721,670 | A | * | 2/1998 | Cochrane et al. | 361/695 |
| 6,185,097 | B1 | * | 2/2001 | Behl | 361/695 |
| 6,213,819 | B1 | | 4/2001 | Fan | |
| 6,215,659 | B1 | | 4/2001 | Chen | |
| 6,280,319 | B1 | * | 8/2001 | Wong et al. | 454/184 |
| 6,285,548 | B1 | * | 9/2001 | Hamlet et al. | 361/695 |
| 6,487,075 | B2 | * | 11/2002 | Negishi | 361/695 |

* cited by examiner

*Primary Examiner*—Derek S. Boles
(74) *Attorney, Agent, or Firm*—Wei Te Chung

(57) ABSTRACT

A computer enclosure, for replaceably securing a first standard sized fan (40) or a second standard sized fan (50) thereto, includes a front panel (10) and a drive bracket (20). The front panel comprising an array of vents (14), a first and a second set of fixing structures (11, 12, 13) corresponding to the first and second standard fans, the first and second set of fixing structures being arranged around the array of vents. The drive bracket is attached to the front panel, and comprises a U-shaped bracket (21) and a pair of opposite first and second side plates (22, 25), the first side plate having a bridge shaped platform (23) for supporting an end of either of the fans, the second side plate forming two pairs of projections (261, 262) engaging respectively in apertures (41, 51) defined in the first and second fans.

20 Claims, 6 Drawing Sheets

COMPUTER ENCLOSURE INCORPORATING FIXING STRUCTURES FOR FANS

BACKGROUND OF THE INVENTION

1. Field of the Invention

The present invention relates to computer enclosures, and particularly to a computer enclosure which can replaceablely secure different standards sized fans thereto. The invention relates to a copending application titled "COMPUTER ENCLOSURE INCORPORATING MOUNTING APPARATUS FOR DISK DRIVES", having the same applicant and the same assignee with the invention.

2. Related Art

A typical contemporary personal computer comprises a central processing unit (CPU) and a power supply. Heat is generated by the CPU, and resulting heated air is removed away from the CPU by an adjacent fan driven by the power supply.

However, a single fan does not always effectively dissipate large amounts of heated air generated from modern powerful CPUs. Accordingly, a second fan is often installed at an outside panel of a computer enclosure, to bring cooling air into the enclosure. The second fan is generally attached to the enclosure with screws. This conventionally requires a tool. The attachment procedure is unduly tedious and inconvenient, especially when the enclosure is small. Furthermore, other components in the enclosure are prone to be accidentally damaged during the attachment procedure.

An alternative means of attachment of a fan to a computer enclosure is shown in U.S. Pat. No. 6,215,659. A fan holder comprises four lateral spring hooks and two longitudinal spring hooks. The enclosure defines four lateral and two longitudinal slots therein. The hooks respectively extend through the slots of the enclosure and engage with the enclosure. Thus, the fan is fastened to the enclosure.

The fan holder does not require screws. However, the fan holder necessarily occupies extra valuable space in the enclosure. In addition, the fan holder is unstandardized, in that each individual fan holder is designed for a specific computer enclosure having its own particular configuration. Once the fan holder is damaged, it is difficult to find a replacement fan holder that matches the particular computer enclosure.

Furthermore, the fan used with the fan holder generally comes in two standard sizes, 92 mm and 80 mm. Each fan holder is configured for either of these standard sizes. A fan holder configured for the larger standard size fan cannot be used for the smaller standard size fan, and vice versa.

Thus, a computer enclosure with holding means which solves the above-mentioned problems is strongly desired.

SUMMARY OF THE INVENTION

Accordingly, an object of the present invention is to provide a computer enclosure which readily and firmly attaches a fan to a panel thereof.

Another object of the present invention is to provide a computer enclosure which allows different standard sized fans to be replaceablely secured to a panel thereof.

To achieve the above-mentioned objects, a computer enclosure in accordance with the present invention for securing a first standard sized fan or a second standard sized fan thereto, comprises a front panel and a drive bracket. The front panel comprises an array of vents defined in a lower portion thereof, a set of first fixing structures corresponding the first standard fan and a set of second fixing structure corresponding the second standard fan around the array of vents. The drive bracket comprises a U-shaped bracket attached to an upper portion of the front panel, and a first and an opposite second side plate attached to the front panel for sandwiching the first or second fan therebetween. The first side plate forms a bridge shaped platform for abutting one side fan of the first or second fan. A tongue is formed from the second side plate by way of stamping, the tongue has a first and second pairs of projections for engaging respectively in apertures defined in the first or second an. The first fan can be attached to the front panel by the first set of fixing structure, the bridge shape platform and the first pair projections of the tongue. The second fan can be attached to the front panel by the second set of fixing structure, the bridge shape platform and the second pair projections of the tongue. Thereby, the two different standards fans can be replaceablely secured to the panel of the computer enclosure.

Other objects, advantages and novel features of the present invention will be drawn from the following detailed description of a preferred embodiment of the present invention with attached drawings, in which:

DESCRIPTION OF THE PREFERRED EMBODIMENT

Figure 1:
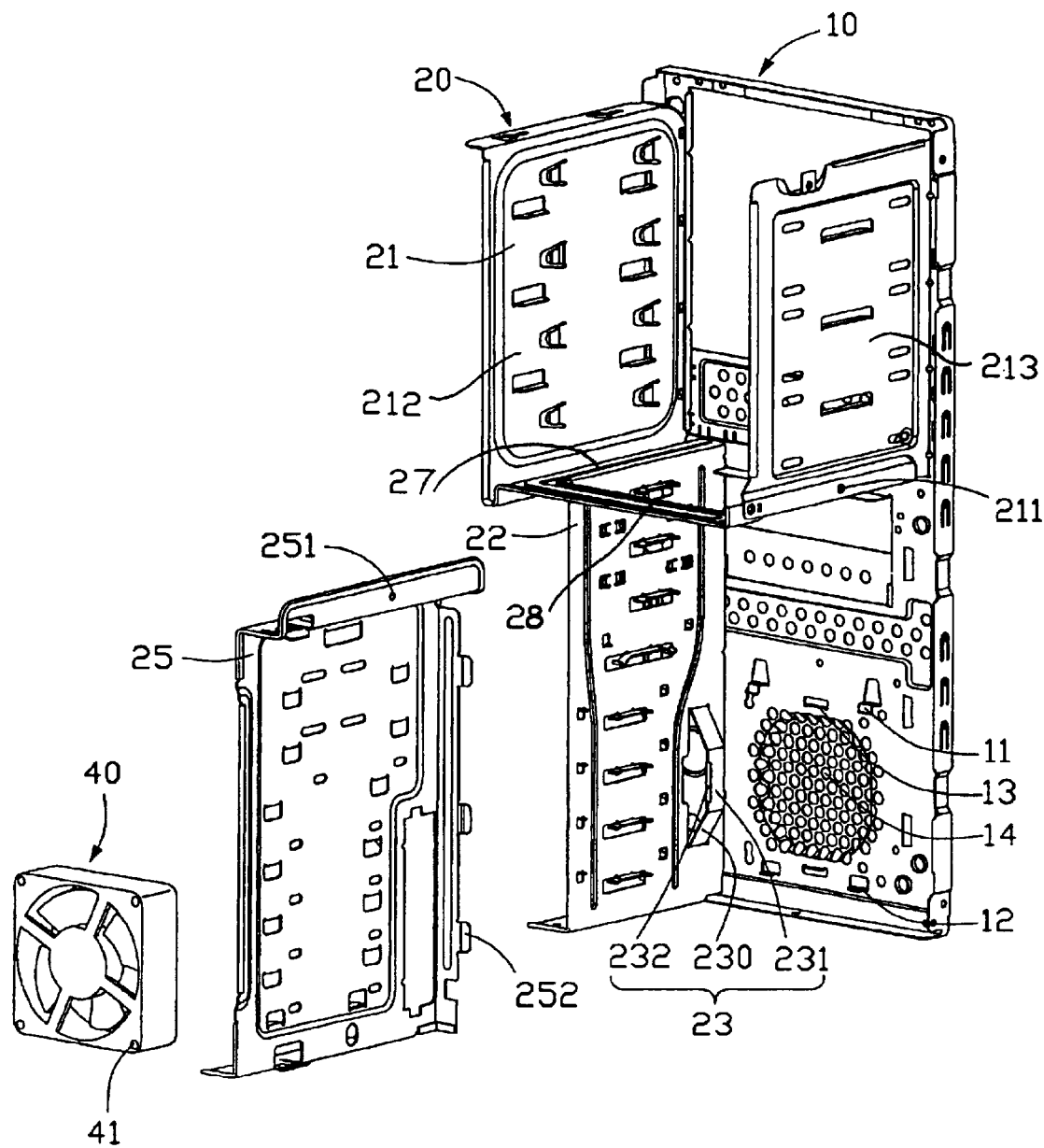
FIG. 1 is an exploded, isometric view of a computer enclosure of the present invention, together with a first standard sized fan.
Figure 2:
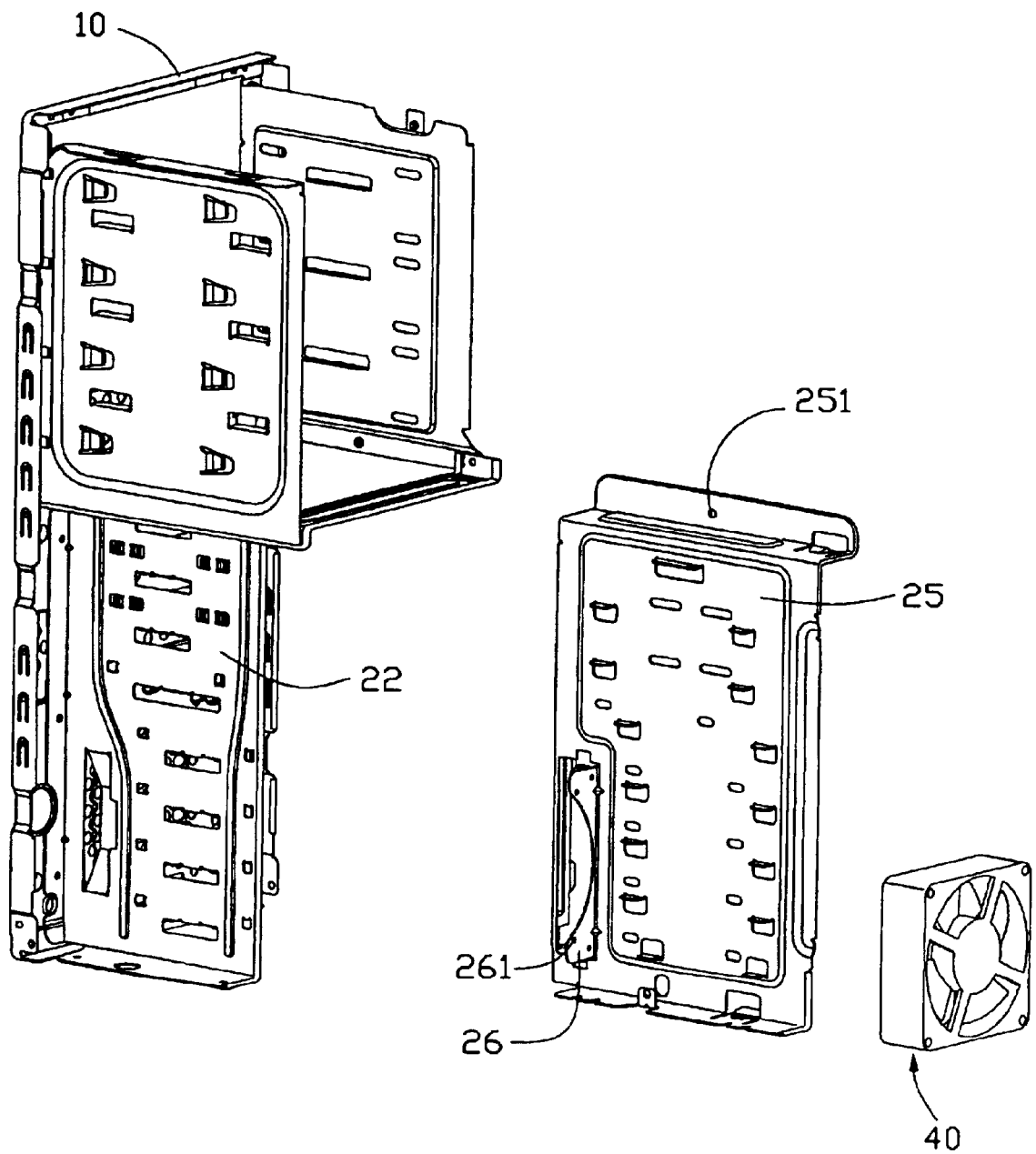
FIG. 2 is similar to FIG. 1, but viewed from another aspect.
Figure 3:
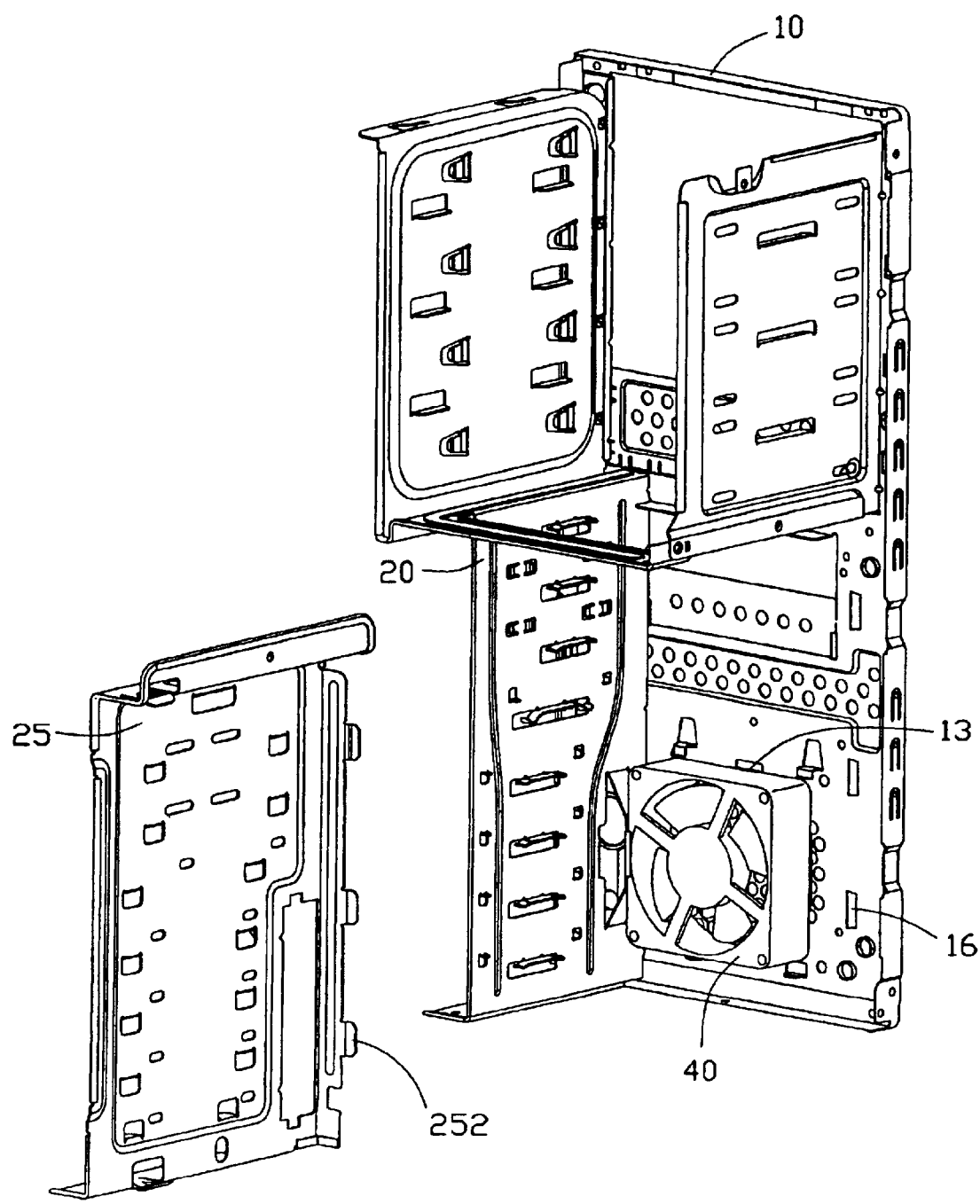
FIG. 3 is a partly assembled view of FIG. 1.
Figure 4:
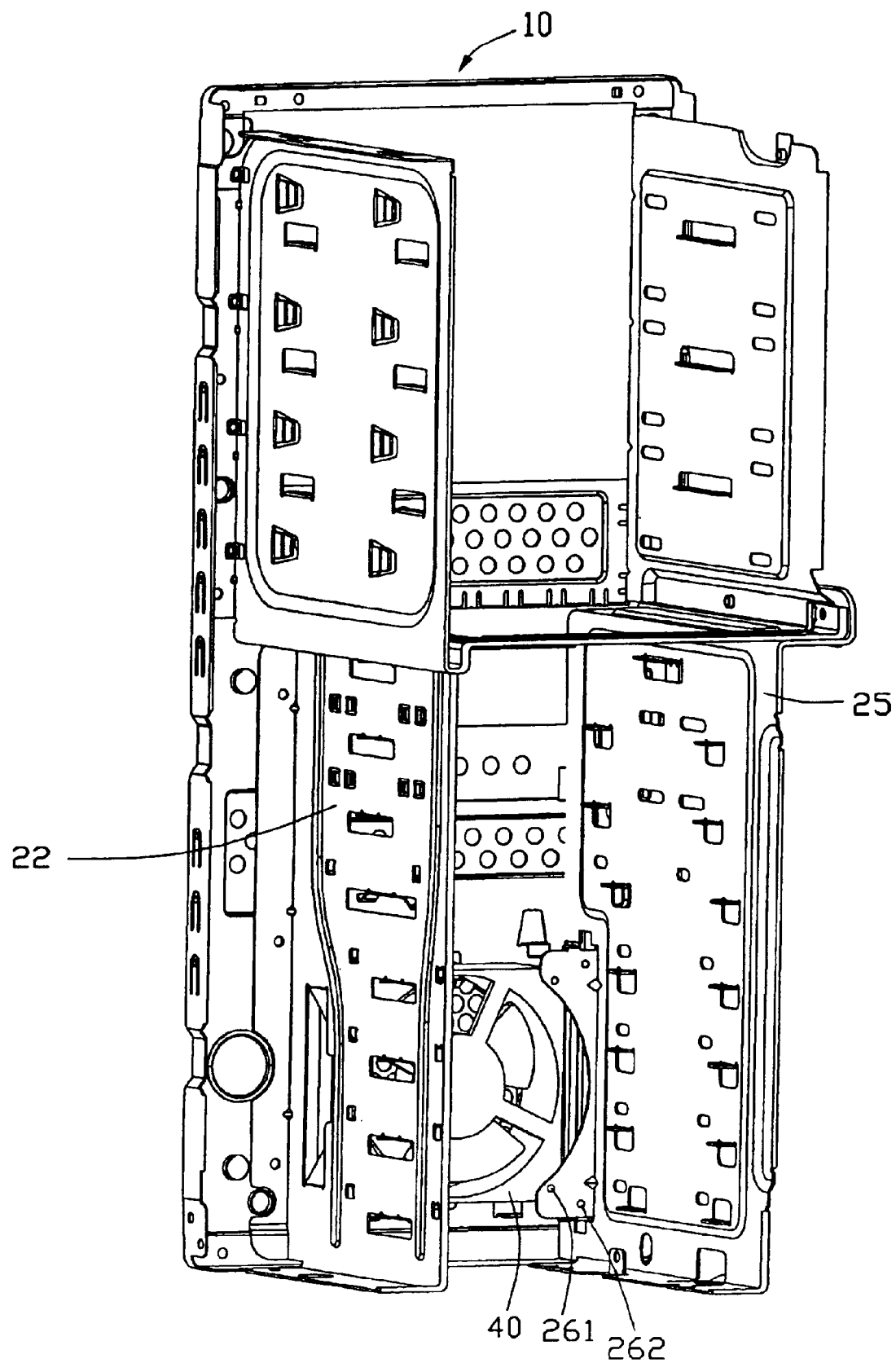
FIG. 4 is a fully assembled view of the computer enclosure and fan of FIG. 1, viewed from another aspect.

Referring to FIGS. 1-6, a computer enclosure of the present invention is used to secure a first standard sized fan 40 or a second standard sized fan 50 thereto. The enclosure comprises a front panel 10, and a drive bracket 20 attached to the front panel 10.

In the preferred embodiment, the standard size of the first fan 40 is 80 mm, and the standard size of the second fan 50 is 92 mm. The first and second fans 40, 50 each define four through apertures 41, 51 at four corners thereof respectively.

The front panel 10 comprises an array of vents 14 defined in a lower portion thereof, a first set of fixing structures corresponding the first fan 40, and a second set of fixing structures corresponding the second fan 50. The first set of fixing structures comprises a pair of first latches 13 extending perpendicularly inwardly from the front panel 10 above and below the array of vents 14 respectively. The second set of fixing structures comprises a pair of L-shaped hooks 11 extending inwardly from the front panel 10 above the array of vents 14, and a pair of second latches 12 extending inwardly from the front panel 10 below the array of vents 14. The positions of the hooks 11 correspond to a height of the second fan 50. A distal end portion of each second latch 12 is bent slightly downwardly to form a flared end (not labeled), for convenient operation during assembly and disassembly. A plurality of aligned slots 16 is defined in a lower portion of the front panel 10, for engagement of the drive bracket 20 thereat.

The drive bracket 20 comprises a U-shaped upper bracket 21 attached to an upper portion of the front panel 10, a first side plate 22 bending and extending from a bottom plate 27 of the U-shaped bracket 21, and a second side plate 25 attached to the front panel 10 opposite from the first side plate 22. The first fan 40 or second fan 50 can thus be sandwiched between the first side plate 22 and the second side plate 25. The bottom plate 27 defines a transverse bar 28 at a rear portion of the U-shaped bracket 21. The U-shaped bracket 21 defines a fixing hole 211 in a side thereof corresponding to the second side plate 25.

It is noted that referring to FIG. 1, the side wall 212 and the bottom plate 27 of the U-shaped bracket 21, and the first side plate 22 are integrally formed from one piece metal sheet, while the side wall 213 is discrete thereform but attached thereto to cooperate with the first side wall 212 and the bottom plate 27 to form the U-shaped upper bracket 21. On the other hand, the first side plate 22 and the second side plate 25 cooperate with the bottom plate 27 to form a lower bracket (not labeled). Clearly, the lower bracket is narrower than the upper bracket for compliance with the drives and/or other electronic components respectively disposed therein. It is noted that the second side plate 25 generally has the same width with the side wall 212 along a front-to-back direction while the first side plate 22 defines the smaller width relative to either the second side plate 25 and the side wall 212. It is because the first side plate 22 is split from the bottom plate 27 to spare material of the transverse bar 28, and can not own the whole width dimension as the side wall 212. Anyhow, this width difference between the first side plate 22 and the second side plate 25 will not jeopardize the function of the lower bracket defined among the first side plate 22, the second side plate 25 and the bottom plate 27.

The first side plate 22 inwardly forms a bridge shaped platform 23 by way of stamping. The bridge shaped platform 23 comprises a central supporting section 231, and two slant sections 230 connecting the supporting section 231 with a main body of the first side plate 22. The supporting section 231 is for abutting one side of the first fan 40 or second fan 50. A flange 232 extends from a rear edge of the supporting section 231, parallel to the front panel 10, for fittingly abutting against the first fan 40 or second fan 50.

The second side plate 25 comprises a flange (not labeled) bent from a top edge portion thereof. A plurality of catches 252 extends from a front edge of the second side plate 25, for engaging in the slots 16 of the front panel 10. A tongue 26 is formed perpendicularly inwardly from the second side plate 25, by way of stamping. A through hole 251 is defined in the flange, corresponding to the fixing hole 211 of the U-shaped bracket 21. The tongue 26 has a pair of projections 261 and a pair of projections 262, for engaging respectively in the apertures 41 of the first fan 40 or the apertures 51 of the second fan 50.

Referring to FIGS. 1-4, in assembly of the first fan 40, the first fan 40 is slid along a path formed by the pair of first latches 13 of the front panel 10 until an end of the first fan 40 contacts the supporting section 231. In this position, the flange 232 fittingly abuts against the first fan 40. Then, the second side plate 25 is attached to the front panel 10. The projections 261 of the second side plate 25 are received in corresponding apertures 41 of the first fan 40, and the catches 252 of the second side plate 25 are engaged in the slots 16 of the front panel 10. A screw (not shown) is extended through the through hole 251 of the second side plate 25 and engaged in the fixing hole 211 of the U-shaped bracket 21. The first fan 40 is thus securely attached to the front panel 10.

Figure 5:
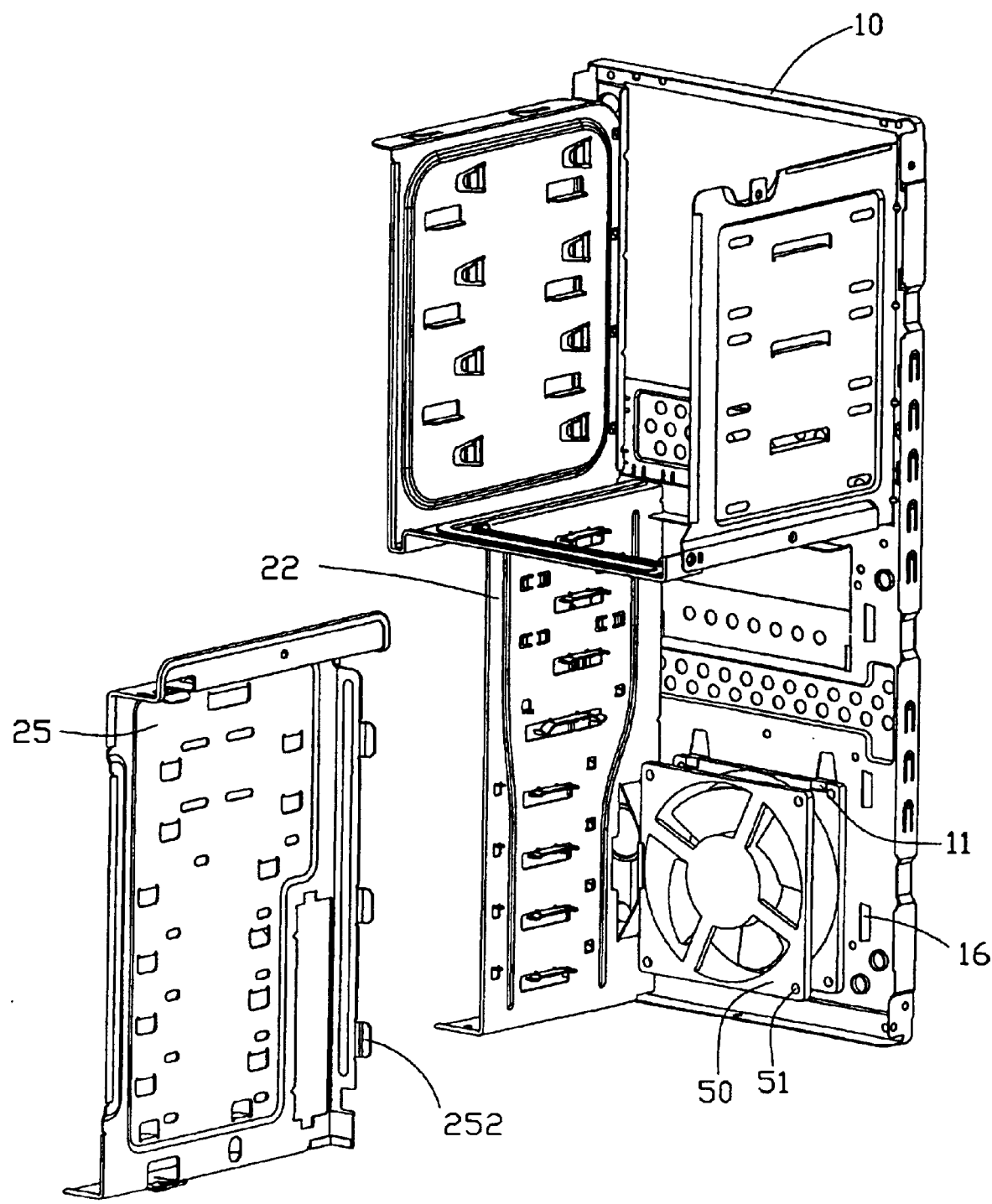
FIG. 5 is a partly assembled view of the computer enclosure of FIG. 1, together with a second standard sized fan.
Figure 6:
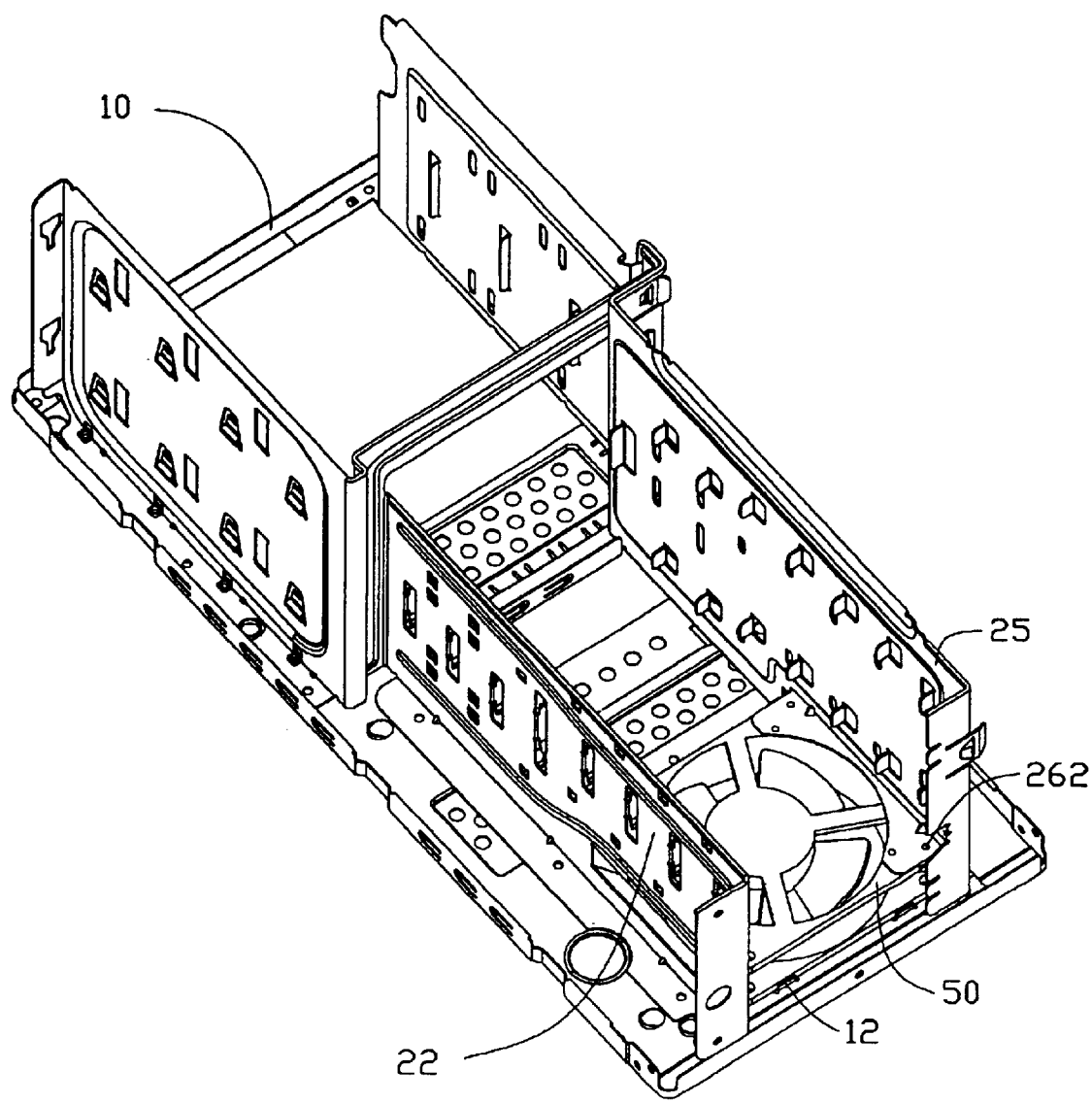
FIG. 6 is a fully assembled view of the computer enclosure and fan of FIG. 5, viewed from another aspect.

Referring to FIGS. 5-6, in assembly of the second fan 50, the second fan 50 is pushed upward until one end thereof is engaged by the hooks 11, and a bottom end thereof is engaged by the second latches 12 via said flared ends thereof. The second fan 50 is pushed toward the first bracket 22 until an end of the second fan 50 contacts the supporting section 231. In this position, the flange 232 abuts against the second fan 50. Then, the second side plate 25 is attached to the front panel 10. The projections 262 of the second side plate 25 are received in corresponding apertures 51 of the second fan 50, and the catches 252 of the second side plate 25 are engaged in the slots 16 of the front panel 10. A screw (not shown) is extended through the through hole 251 of the second side plate 25 and engaged in the fixing hole 211 of the U-shaped bracket 21. The second fan 50 is thus securely attached to the front panel 10. It is noted that the first latch 13, due to the properly designed contour and position thereof, will not interfere with the second fan 50 during installation.

It is understood that the invention may be embodied in other forms without departing from the spirit thereof. Thus, the present example and embodiment is to be considered in all respects as illustrative and not restrictive, and the invention is not limited to the details given herein.

What is claimed is:

1. A computer enclosure adapted to replaceably secure a first sized fan or a second sized fan thereto, comprising:

a panel comprising an array of vents, a first set of fixing structures for retaining the first sized fan to the panel in a first direction and a second set of fixing structures for retaining the second sized fan to the panel in the first direction, the first and second sets of fixing structures being arranged around the array of vents; and a drive bracket attached to the panel, the drive bracket comprising first and second plates for sandwiching the first or second sized fan therebetween thereby retaining the first or second sized fan in second and third directions that are perpendicular to each other, the second and third directions both being perpendicular to the first direction, one of the first plate and the second plate forming at least one first projection for engaging with the first sized fan and at least one second projection for engaging with the second sized fan.

2. The computer enclosure as described in claim 1, wherein the first set of fixing structures comprises a pair of first latches extending perpendicularly inwardly from the panel above and below the array of vents respectively for sandwiching the first sized fan therebetween.

3. The computer enclosure as described in claim 2, wherein the second set of fixing structures comprises a pair of L-shaped hooks extending inwardly from the panel above the array of vents, and a pair of second latches extending inwardly from the panel below the array of vents, the hooks and the second latches adapted for cooperatively sandwiching the second sized fan therebetween, distal end portions of the second latches being flared for convenient operation during assembly and disassembly.

4. The computer enclosure as described in claim 1, wherein a plurality of slots is defined in a lower portion of the panel, the slots engagingly receiving a plurality of catches extending from the second plate.

5. The computer enclosure as described in claim 1, wherein the computer enclosure further comprises a U-shaped bracket attached to an upper portion of the panel, the first plate integrally extending from a bottom plate of the U-shaped bracket.

6. The computer enclosure as described in claim 5, wherein the U-shaped bracket defines a fixing hole in a side thereof, and the second plate defines a through hole for extension of a fastener to engage in the fixing hole.

7. The computer enclosure as described in claim 1, wherein the first plate comprises a platform comprising a central supporting section and two slant sections connecting the supporting section with a main body of the first side plate, a flange extending from the supporting section for fitly abutting against the first or second sized fan toward the panel.

8. The computer enclosure as described in claim 1, wherein a tongue is formed perpendicularly inwardly from the second side plate by stamping, and the at least one first projection and the at least one second projection are formed on the tongue.

9. A computer enclosure adapted to replaceably secure any one of at least two different sized fans thereto, comprising:
   a panel comprising a plurality of vents and at least two sets of fixing structures corresponding to said at least two different sized fans respectively, the at least two sets of fixing structures adapted for sandwiching said at least two different sized fans in a first direction; and
   a drive bracket attached to the panel, the drive bracket comprising a pair of opposite first and second side plates for sandwiching any one of said at least two different sized fans therebetween in a second direction, a securing tongue cooperating with the panel for sandwiching said any one of said at least two different sized fans therebetween in a third direction, and at least two projections for engaging respectively in said at least two different sized fans thereby locating any one of said at least two different sized fans in the computer enclosure, the first, second and third directions being perpendicular to one another.

10. The computer enclosure as described in claim 9, wherein a first set of the at least two sets of fixing structures comprises a pair of first latches extending perpendicularly inwardly from the panel at opposite positions above and below the plurality of vents.

11. The computer enclosure as described in claim 10, wherein a second set of the at least two sets of fixing structures comprise a pair of L-shaped hooks extending inwardly from the panel above the plurality of vents, and a pair of second latches extending inwardly from the panel below the plurality of vents, a length of each hook corresponding to a thickness of one of said at least two different sized fans, a distal end portion of each second latch being flared for convenient operation during assembly and disassembly.

12. The computer enclosure as described in claim 9, wherein a plurality of slots is defined in a lower portion of the panel, the slots engagingly receiving a plurality of catches extending from the second side plate.

13. The computer enclosure as described in claim 9, further comprising a U-shaped bracket attached to an upper portion of the panel, the first side plate bending and extending from a bottom plate of the U-shaped bracket.

14. The computer enclosure as described in claim 9, wherein the U-shaped bracket defines a fixing hole in a side thereof, and the second side plate defines a through hole corresponding to the fixing hole.

15. The computer enclosure as described in claim 9, wherein the first side plate inwardly forms a platform by way of stamping, the platform comprises a supporting section and two slant sections connecting the supporting section with a main body of the first side plate, and a flange extends from the supporting section for fitly abutting against on any one of said at least two different sized fans.

16. The computer enclosure as described in claim 9, wherein the tongue is formed perpendicularly inwardly by stamping.

17. A computer enclosure assembly comprising:
   an enclosure including:
   a panel defining a lengthwise direction thereof and an array of apertures therein;
   two sets of first retention devices formed on an interior face of the panel and defining two different dimensions along said lengthwise direction;
   a fan positionably retained by one corresponding set of the first retention device in said lengthwise direction;
   opposite first and second side plates located inside the panel, each of said first and second side plates defining a second retention device restricting said fan from moving along a transverse direction perpendicular to said lengthwise direction and along a front-to-back direction perpendicular to both said lengthwise direction and said transverse direction; wherein
   the second retention device of at least one of said first and second side plates defines two different retention positions, and said fan is secured to one of said two retention positions, whereby
   another fan is adapted to be secured to the enclosure by means of the other set of the first retention device on the panel and the other position of the at least one of said first and second side plates, so that the enclosure is allowed to receive two different fans mutually exclusively.

18. A computer enclosure comprising
   a panel defining a plurality of openings extending therethough in a front-to-back direction;
   upper and lower bracket units formed behind the panel along thereof a lengthwise direction perpendicular to said front-to-back direction,
   said upper bracket unit including two opposite side walls, and a bottom plate integrally extending from one of said side walls with thereof a transverse bar extending along a transverse direction perpendicular to both said front-to-back direction and said lengthwise direction; and
   said lower bracket unit including a first side plate split and integrally extending downwardly from the bottom plate, and a second side plate opposite to the first side plate; wherein
   said upper bracket unit is larger than the lower bracket unit along said transverse direction, and said first side plate, which is integrally formed with the bottom plate and the corresponding one of the side walls, is smaller than the said corresponding one of the side walls in said front-to-back direction.

19. The enclosure as described in claim 18, wherein said first side plate is smaller than the second side plate in said front-to-back direction.

20. The enclosure as described in claim 18, wherein a distal end of said transverse bar is engaged with the second side plate.

* * * * *